United States Patent
Sekijima (10) Patent No.: US 9,374,888 B2
(45) Date of Patent: Jun. 21, 2016

(54) DIFFERENTIAL TRANSMISSION CIRCUIT HAVING AN INDUCTOR UNIT AND CAPACITOR UNITS CONFIGURED TO ATTENUATE A COMMON-MODE DIGITAL SIGNAL COMPONENT

(75) Inventor: Daishiro Sekijima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/344,298

(22) PCT Filed: Sep. 10, 2012

(86) PCT No.: PCT/JP2012/005703
§ 371 (c)(1),
(2), (4) Date: Mar. 11, 2014

(87) PCT Pub. No.: WO2013/038634
PCT Pub. Date: Mar. 21, 2013

(65) Prior Publication Data
US 2014/0340167 A1    Nov. 20, 2014

(30) Foreign Application Priority Data

Sep. 14, 2011 (JP) .................................. 2011-200177
Jul. 26, 2012 (JP) .................................. 2012-165845

(51) Int. Cl.
| H05K 1/02 | (2006.01) |
| H04L 25/02 | (2006.01) |
| H03H 7/42 | (2006.01) |
| H03H 7/01 | (2006.01) |

(52) U.S. Cl.
CPC ........... *H05K 1/0245* (2013.01); *H03H 7/0161* (2013.01); *H03H 7/427* (2013.01); *H04L 25/0276* (2013.01); *H05K 1/0216* (2013.01); *H04L 25/028* (2013.01)

(58) Field of Classification Search
CPC ........................... H05K 1/0245; H05K 1/0216
USPC .......................................... 333/4, 5, 12, 181
See application file for complete search history.

(56) References Cited

U.S. PATENT DOCUMENTS

| 4,667,173 A | 5/1987 | Okochi |
| 5,061,913 A | 10/1991 | Okochi |

(Continued)

FOREIGN PATENT DOCUMENTS

JP     H04-372213 A     12/1992

OTHER PUBLICATIONS

Wang Shuo et al: "Effects of Parasitic Parameters on EMI Filter Performance;" IEEE Transactions of Power Electronics, vol. 19, No. 3, May 2004; pp. 869-877.

*Primary Examiner* — Benny Lee
(74) *Attorney, Agent, or Firm* — Canon USA, Inc. IP Division (57) ABSTRACT

A low pass filter 6 comprises an inductor unit 8 comprising first and second inductors 11 and 12, an input side capacitor unit 7 provided on a signal input side of the inductor unit 8, and an output side capacitor unit 9 provided on a signal output side of the inductor unit 8. The input side capacitor unit 7 comprises a first capacitor 21 provided between the signal lines. Further, the input side capacitor unit 7 comprises a second capacitor 22 wherein one end is connected to a signal input end 11a of the first inductor 11, and the other end is connected to a ground (GND), and a third capacitor 23 wherein one end is connected to a signal input end 12a of the second inductor 12, and the other end is connected to a ground (GND).

10 Claims, 5 Drawing Sheets

(56) References Cited

U.S. PATENT DOCUMENTS

| | | |
|---|---|---|
| 6,448,863 B1 * | 9/2002 | Ogawa et al. .................. 333/12 |
| 6,696,852 B1 | 2/2004 | Brunolli |
| 2004/0155720 A1 * | 8/2004 | Yasui et al. .................... 333/12 |
| 2005/0088256 A1 * | 4/2005 | Gottlieb et al. ............... 333/181 |
| 2007/0188265 A1 | 8/2007 | Perreault |
| 2007/0188266 A1 * | 8/2007 | Kebinger et al. ............. 333/181 |
| 2010/0277256 A1 * | 11/2010 | Concord ....................... 333/177 |

* cited by examiner

DIFFERENTIAL TRANSMISSION CIRCUIT HAVING AN INDUCTOR UNIT AND CAPACITOR UNITS CONFIGURED TO ATTENUATE A COMMON-MODE DIGITAL SIGNAL COMPONENT

TECHNICAL FIELD

The present invention relates to a differential transmission circuit applied to a digital data transmission system for electrical and electronic devices.

BACKGROUND ART

The demands on high-speed and high-definition has been increasing on electrical and electronic devices such as the ones represented by digital multifunction peripherals, or digital cameras of recent years, and high-speed transmission of large volume of digital signals has become necessary. Consequently, differential signal transmission system capable of transmitting large volume of data at high speeds has become widespread use.

In the differential signal transmission system, fundamental signals necessary for the signal transmission are transmitted to a pair of signal lines by normal-mode component in which amplitudes are substantially equal and their polarities are mutually reversed. Further, signals of harmonic wave component with frequencies of the fundamental signals are also included in the normal-mode component, in addition to the component of fundamental signals necessary for the signal transmission. However, the normal-mode component cancels the magnetic fluxes of each other out. Since the magnetic fluxes are generated by the mutual electric currents the normal-mode component can suppress radiation noise from differential transmission paths arising from the harmonic wave component.

On the other hand, in the differential signal transmission system, signals of the common-mode component with the same polarity are also transmitted to the pair of signal lines, in addition to the normal-mode component. The normal-mode component is converted into the common-mode component by the unbalanced property of the normal-mode component arising from the differential signal transmission unit, or unbalance on the pair of signal lines, resulting in generation of the common-mode component. Further, since the common-mode component allows electrical currents to flow in the same direction of each other on the pair of signal lines, and the generated magnetic fluxes are mutually strengthened, radiation noise from the differential transmission path will become large.

As a method for suppressing such a radiation noise, Japanese Patent Application Laid-Open 4-372213 discusses that radiation noise is suppressed by performing band limitation by a low pass filter (LPF) which allows a frequency spectrum necessary for data reproduction to pass the LPF at the differential signal reception unit, and removing an unnecessary spectrum with a high-frequency band.

Figure 7:
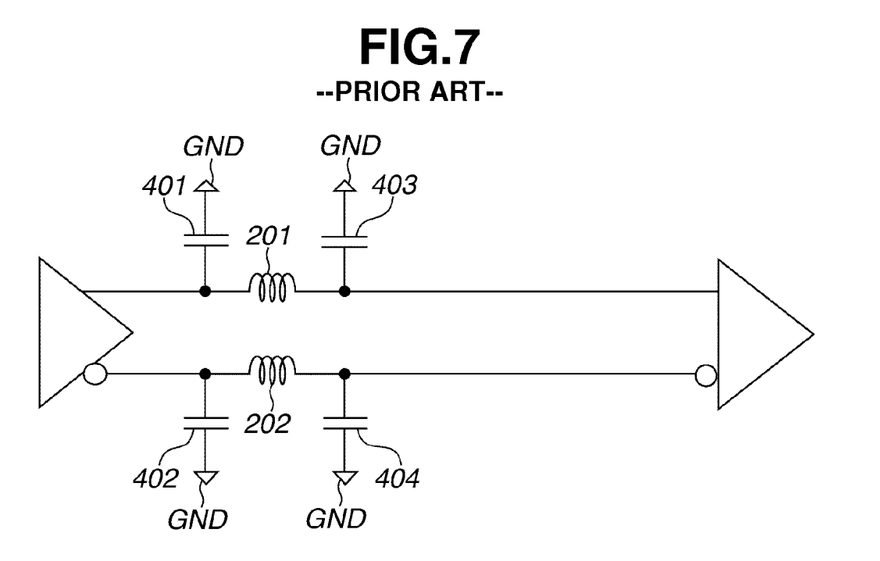
FIG. 7 is an electrical circuit diagram illustrating a schematic configuration of the differential transmission circuit of conventional example.

FIG. 7 is an electrical circuit diagram illustrating a configuration of simplified LPF in Japanese Patent Application Laid-Open 4-372213. In the case of the LPF illustrated in FIG. 7, the normal-mode component reduces an amount of transmission of its harmonic wave component, by a capacitor 401, an inductor 201 and a capacitor 403, a capacitor 402, an inductor 202 and a capacitor 404 which constitute a pi type filter. On the other hand, by allowing the common-mode component to flow to a ground (GND) mainly via the capacitors 401 and 402, the amount of transmission of the common-mode component is reduced. In other words, employing such a configuration seeks to reduce the common-mode component arising from the differential signal transmission unit, and to reduce radiation noise from the pair of signal lines.

However, capacitance values of commonly available commercial capacitors, although they fall within standards, have not yet completely conformed to them. Normally they contain errors on the order of plus or minus 10%. A variation of the capacitance values of the capacitors has significant influence, when a frequency of a signal to be transmitted becomes 1 GHz or higher.

In Japanese Patent Application Laid-Open 4-372213, a variation is present in values of capacitances of the capacitors 401, 402, 403, and 404 connected to the ground (GND). When there is a variation in the values of capacitances of the capacitors 401, 402, 403, and 404, it follows that unbalance is present on the pair of signal lines. As a result, the normal-mode component will be converted into the common-mode component, and the common-mode component will be generated. Therefore, since in a conventional LPF, an amount of generation of the common-mode component is large, and reduction effect of radiation noise is low, and therefore it is necessary to suppress the generation of the common-mode component in the LPF.

CITATION LIST

Patent Literature

PTL 1: Japanese Patent Application Laid-Open 4-372213

SUMMARY OF THE INVENTION

The present invention is directed to providing a differential transmission circuit capable of reducing radiation noise by suppressing generation of common-mode component by an LPF.

According to an aspect of the present invention, a differential transmission circuit comprises a differential signal transmission unit configured to transmit a differential signal, a differential signal reception unit configured to receive the differential signal, and a first signal line and a second signal line that connect the differential signal transmission unit and the differential signal reception unit, the differential transmission circuit comprises a low pass filter comprising an inductor unit having a first inductor provided on the first signal line and a second inductor provided on the second signal line, an input side capacitor unit having a first capacitor wherein one end is connected to a signal input end of the first inductor, and the other end is connected to a signal input end of the second inductor, a second capacitor wherein one end is connected to the signal input end of the first inductor, and the other end is connected to a ground, and a third capacitor wherein one end is connected to the signal input end of the second inductor, the other end is connected to a ground, configured to attenuate a common-mode component contained in a differential signal, and an output side capacitor unit having an output side capacitor provided between the inductor unit and the differential signal reception unit, configured to attenuate a normal-mode component contained in the differential signal in cooperation with the inductor unit and the input side capacitor unit.

According to the present invention, a common-mode component generated due to a variation of values of capacitances of the second capacitor and third capacitor in an input side capacitor unit is suppressed. Therefore, since a differential signal in which the common-mode component has been reduced is output from the low pass filter, radiation noise from the first and second signal lines is reduced.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAIL DESCRIPTION OF PREFERRED EMBODIMENTS

Various exemplary embodiments, features, and aspects of the invention will be described in detail below with reference to the drawings.

Figure 1:
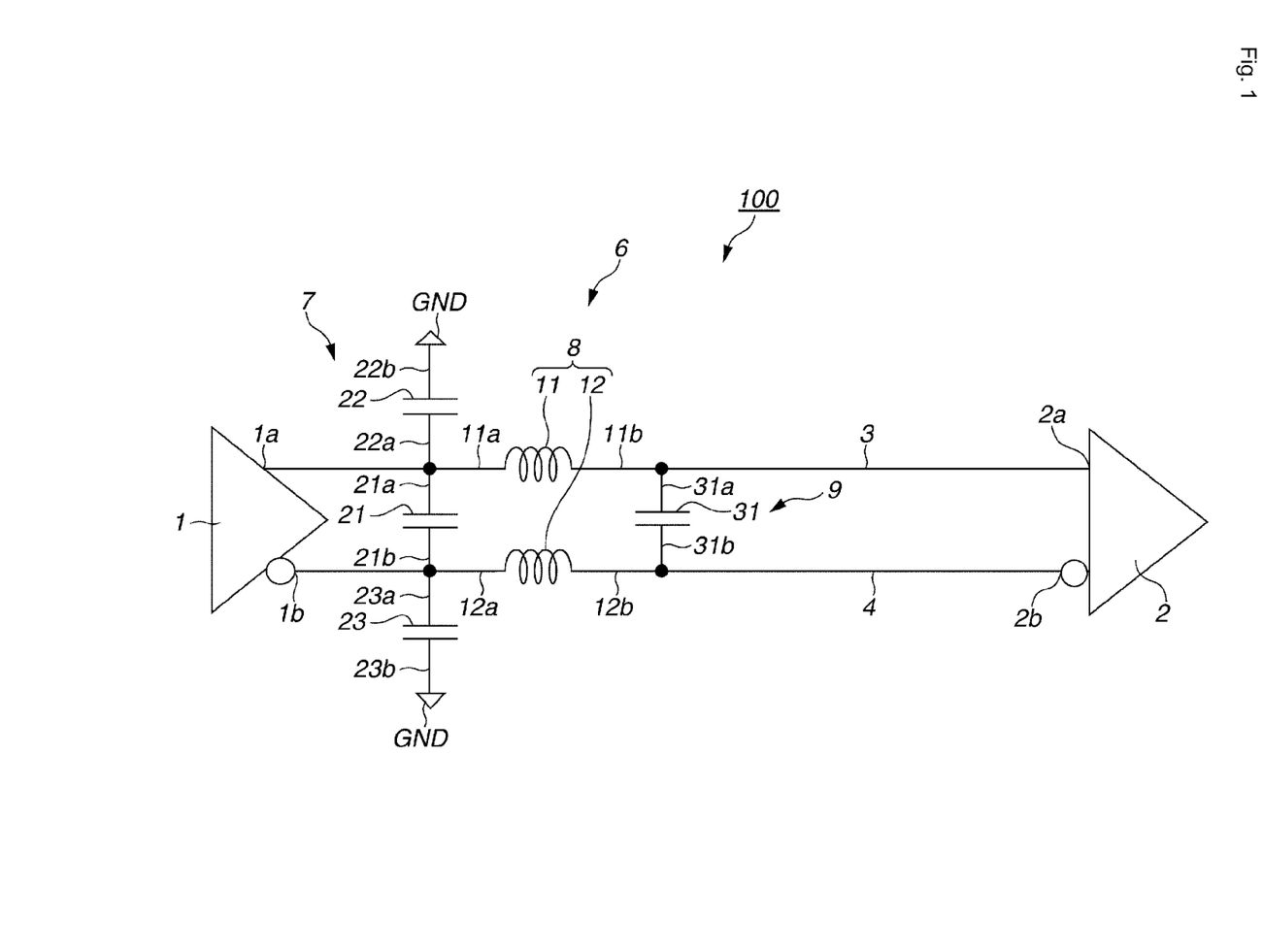
FIG. 1 is an electrical circuit diagram illustrating a schematic configuration of a differential transmission circuit according to the exemplary embodiment.

FIG. 1 is an electrical circuit diagram illustrating a schematic configuration of a differential transmission circuit according to the exemplary embodiment of the present invention. A differential transmission circuit 100 comprises a differential signal transmission unit 1 composed of a semiconductor element, a differential signal reception unit 2 composed of a semiconductor element, and a first signal line 3 and a second signal line 4 that electrically connect the differential signal transmission unit 1 and the differential signal reception unit 2. Specifically, a first transmission terminal 1a as a first transmission end of the differential signal transmission unit 1 and a first reception terminal 2a as a first reception end of the differential signal reception unit 2 are electrically connected by the first signal line 3. Further, a second transmission terminal 1b as a second transmission end of the differential signal transmission unit 1 and a second reception terminal 2b as a second reception end of the differential signal reception unit 2 are electrically connected by the second signal line 4. A differential transmission path is configured by a pair of these signal lines 3 and 4.

The differential signal transmission unit 1, by outputting a differential signal to the pair of signal lines 3 and 4, transmits the differential signal to the differential signal reception unit 2. The differential signal reception unit 2 receives the differential signal transmitted by the differential signal transmission unit 1. The differential signal is a digital signal, and is a serial signal obtained by serializing data. Then, from the differential signals, a signal component transmitted on the first signal line 3 and a signal component transmitted on the second signal line 4 are mutually in antiphase. The differential signal reception unit 2 discriminates a voltage level (high-level, or low-level) of the differential signal from a difference between the voltages of these signal components, and reproduces the data.

Further, the differential transmission circuit 100 comprises a low pass filter (hereinafter, referred to as an LPF) 6 provided on the first and second signal lines 3 and 4. The LPF 6 includes the vicinity of the differential signal transmission unit 1. Hereinbelow, a concrete configuration will be described.

The LPF 6 comprises an inductor unit 8, an input side capacitor unit 7 provided on an input side of the inductor unit 8, and an output side capacitor unit 9 provided on an output side of the inductor unit 8.

The inductor unit 8 comprises a first inductor 11 provided on the first signal line 3, and a second inductor 12 provided on the second signal line 4. The inductors 11 and 12 are provided in series on the signal lines 3 and 4, and one terminals (one ends) 11a and 12a of the inductors 11 and 12 serve as signal input ends, and the other terminals (the other ends) 11b and 12b serve as signal output ends.

The input side capacitor unit 7 comprises three capacitors 21, 22, and 23. The first capacitor 21 has one terminal (one end) 21a electrically connected to the signal input end 11a of the first inductor 11 and the other terminal (the other end) 21b electrically connected to the signal input end 12a of the second inductor 12. In other words, the first capacitor 21 is provided between the signal lines 3 and 4.

The second capacitor 22 has one terminal (one end) 22a electrically connected to the signal input end 11a of the first inductor 11 and the other terminal (the other end) 22b electrically connected to a ground (GND). In other words, the one end 22a of the second capacitor 22 is connected to the first signal line 3.

Further, the third capacitor 23 has one terminal (one end) 23a electrically connected to the signal input end 12a of the second inductor 12 and the other terminal (the other end) 23b electrically connected to the ground (GND). In other words, the one end 23a of the third capacitor 23 is connected to the second signal line 4.

The output side capacitor unit 9 comprises a fourth capacitor 31 provided between the inductor unit 8 and the differential signal reception unit 2. More specifically, the fourth capacitor 31 is a capacitor element that has one terminal (one end) 31a electrically connected to the signal output end 11b of the first inductor 11 and the other terminal (the other end) 31b electrically connected to the signal output end 12b of the second inductor 12.

The input side capacitor unit 7, the inductor unit 8, and the output side capacitor unit 9 act as a pi type filter with respect to the normal-mode component. Therefore, by cooperating each other by the input side capacitor unit 7, the inductor unit 8, and the output side capacitor unit 9 which act as the pi type filter, the normal-mode component (specifically, the component that has higher frequency zone than a first envelope, namely, harmonic wave component) contained in the differential signal is attenuated.

On the other hand, the common-mode component contained in the differential signal output from the differential signal transmission unit 1 mainly passes through the second and third capacitors 22 and 23 of the input side capacitor unit 7 and flows to the ground (GND). Therefore, the common-mode component contained in the differential signal output from the differential signal transmission unit 1 is effectively attenuated by the LPF 6.

In the present exemplary embodiment, the second capacitor 22 and the third capacitor 23 use the capacitor elements having the same nominal value of the capacitances. Assume a nominal value of capacitance of the first capacitor 21 is C1, and each nominal value of capacitances of the second and third capacitors 22 and 23 is C2. Assume a value of combined capacitance of the input side capacitor unit 7 is CT, with respect to a signal of the normal-mode component, and then the CT is expressed by the following Equation 1.

$$C_T = C_1 + \frac{C_2}{2} \quad \text{(Equation 1)}$$

On the other hand, in FIG. 7 illustrating the conventional example, the CT is expressed by the following Equation 2.

$$C_T = \frac{C_2}{2} \quad \text{(Equation 2)}$$

The value of the combined capacitance value CT is uniquely determined, since it is one of the elements which constitute the LPF 6 of FIG. 1. Consequently, in the configuration of the present exemplary embodiment, the first capacitor 21 of FIG. 1 having the nominal value C1 is inserted, thereby a value of the nominal value C2 of the second and third capacitors 22 and 23 of FIG. 1 can be made smaller than that of the conventional example.

Even if the capacitors have the same nominal value, a variation is present in the values of actual capacitances due to tolerance. In this way, even if there is a variation between a value of capacitance of the second capacitor 22, and a value of capacitance of the third capacitor 23, capacitor elements with smaller nominal value C2 than conventional are used. As a result, a magnitude of the variation of the capacitances becomes smaller than conventional. In other words, it becomes possible to decrease an error with respect to the combined capacitance value CT. Therefore, in the input side capacitor unit 7 of FIG. 1, the conversion from normal-mode component to the common-mode component, namely, generation of the common-mode component can be suppressed.

Therefore, since the LPF 6 attenuates the common-mode component contained in the differential signal, and suppresses the generation of the common-mode component as well, radiation noise from the first and second signal lines 3 and 4 of FIG. 1 can be reduced.

Furthermore, in the present exemplary embodiment, since a fourth capacitor 31 is connected between the signal output ends 11b and 12b of the inductors 11 and 12 as shown in FIG. 1, the generation of the common-mode component attributable to a variation of capacitance values of the two conventional capacitors 403 and 404 (FIG. 7) is prevented. Therefore, in the present exemplary embodiment, the generation of the common-mode component is prevented by the output side capacitor unit 9 of FIG. 1, and radiation noise from the first and second signal lines 3 and 4 can be more effectively reduced.

Figure 2:
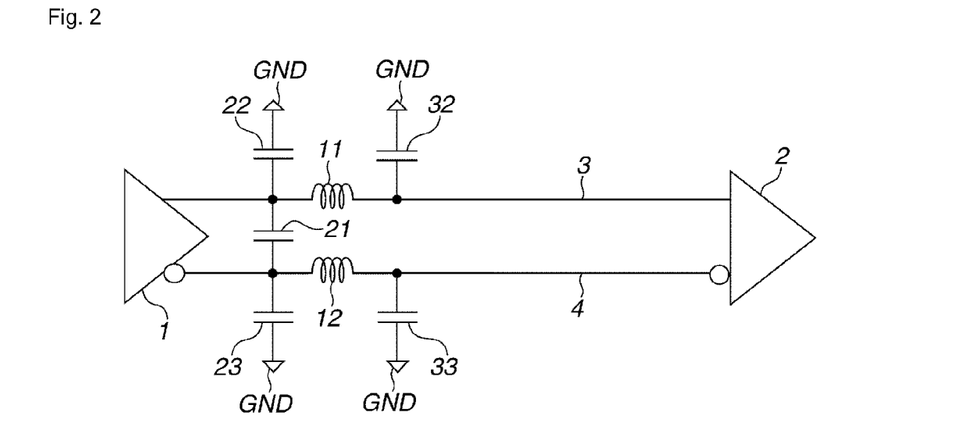
FIG. 2 is an electrical circuit diagram illustrating a schematic configuration of the differential transmission circuit according to another exemplary embodiment.
Figure 3:
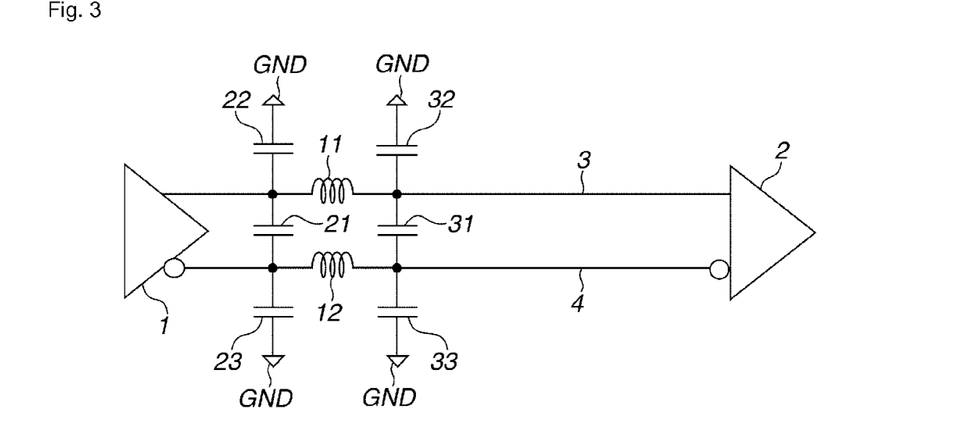
FIG. 3 is an electrical circuit diagram illustrating a schematic configuration of the differential transmission circuit according to yet another exemplary embodiment.

The output side capacitor unit 9 of FIG. 1 may take on an alternative form which comprises a fifth capacitor 32, and a sixth capacitor 33 as illustrated in FIG. 2, other than a form which comprises only the fourth capacitor 31 illustrated in FIG. 1. The fifth capacitor 32 in FIG. 2 has one terminal (one end) electrically connected to a signal output end of the first inductor 11 and the other terminal (the other end) electrically connected to a ground (GND). In other words, the one end of the fifth capacitor 32 is connected to the first signal line 3. Further, the sixth capacitor 33 has one terminal (one end) electrically connected to the signal output end of the second inductor 12 and the other terminal (the other end) electrically connected to the ground (GND). In other words, the one end of the sixth capacitor 33 is connected to the second signal line 4. In FIG. 2, the same reference numerals are assigned to the similar members to those in FIG. 1, and therefore descriptions thereof will not be repeated. Further, the output side capacitor unit 9 of FIG. 1, as illustrated in FIG. 3, may take on a form comprising a fourth capacitor 31, the fifth capacitor 32, and the sixth capacitor 33. In FIG. 3, the same reference numerals are assigned to the similar members to those in FIG. 1 or FIG. 2, and therefore descriptions thereof will not be repeated.

Next, specific exemplary embodiments of the differential transmission circuit 100 according to the exemplary embodiment of the present invention illustrated in FIG. 1 will be described.

In the differential transmission circuit 100 illustrated in FIG. 1, inductance values L1 and L2 of the first and second inductors 11 and 12 is 39 nH, a capacitance value C3 of the fourth capacitor 31 is 2.7 pF, and the combined capacitance value CT in the input side capacitor unit 7 is 18 pF.

Assuming that the second and third capacitors 22 and 23 have a variation (tolerance) of plus or minus 10% with respect to the nominal value C2, simulation has been performed in a state where the second and third capacitors 22 and 23 have a variation of 20% as a maximum value of the variations, to calculate the amount of generation of the common-mode component. For the simulation, using S parameter calculation of 4-port, a reference impedance of each of ports (1a, 2a, 1b, and 2b) is set to 50 Ohm, and a frequency range for calculation to 1 GHz.

Figure 4:
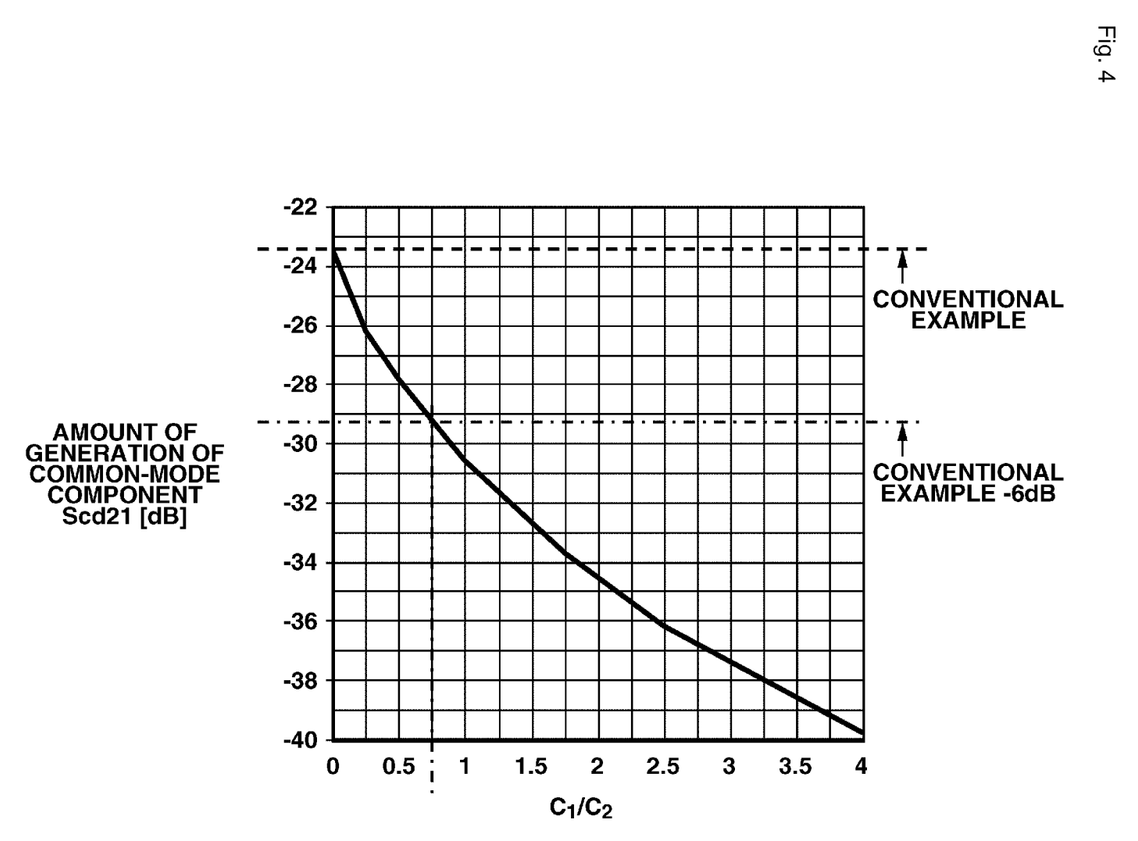
FIG. 4 is a graph representing a maximum value of an amount of generation of a common-mode component, versus a ratio of C1 to C2.

FIG. 4 is a graph illustrating a maximum value of an amount of generation of the common-mode component generated in the LPF 6, versus a ratio of C1 to C2 (C1/C2). In FIG. 4, the horizontal axis indicates a ratio of C1 to C2 (C1/C2), and the vertical axis indicates a maximum value of the amount of generation of the common-mode component. In FIG. 4, a common-mode component (i.e., Scd21 [dB]) generated from the LPF 6 which satisfies the conditions of the above-described element values is indicated by a solid line. For example, to set the CT to 18 pF, when (C1/C2) is 1, a capacitance value C1 of the capacitor 21 becomes 12 pF, and a capacitance value C2 of the capacitors 22 and 23 becomes 12 pF. However, since C2 has a variation of 20%, calculation is performed assuming the capacitor 22 is 13.2 pF, and the capacitor 23 is 10.8 pF. Further, to set the CT to 18 pF, when (C1/C2) is 2, the capacitance value C1 of the capacitor 21 becomes 14.4 pF, and the capacitance value C2 of the capacitors 22 and 23 becomes 7.2 pF. However, since C2 has a variation of 20%, calculation is performed assuming the capacitor 22 is 6.48 pF, and the capacitor 23 is 7.92 pF.

In a configuration of the LPF of the conventional example illustrated in FIG. 7, an inductance value of the inductors 201 and 202 is 39 nH, a capacitance value C4 of each of the capacitors 403 and 404 is 5.4 pF, and a combined capacitance value CT of the capacitors 401 and 402 is 18 pF. Assuming that the capacitance value C2 of the capacitors 401 and 402, and the capacitance value C4 of the capacitors 403 and 404 have a variation of plus or minus 10%, the simulation is performed, in a state where they have a variation of 20% as a maximum value of the variations. Specifically, assuming the capacitor 401 is 32.4 pF, the capacitor 402 is 39.6 pF, the capacitor 403 is 5.94 pF, and the capacitor 404 is 4.86 pF, the amount of generation of the common-mode component is calculated. The results of the conventional example are indicated by dotted lines in FIG. 4.

As illustrated in FIG. 4, it can be seen that, as a value of the ratio of C1 to C2 increases, the amount of generation of the common-mode component is suppressed. Further, generally, as an indicator value of a status where radiation noise has been suppressed, 6 dB would be enough as reduction effect. From FIG. 4, as for a value of the ratio of C1 to C2 to reduce the conventional example by 6 dB in comparison with the conventional example, the value becomes 0.75. In other words, if a value of the ratio of C1 to C2 is equal to or more than 0.75, an amount of generation of the common-mode component in the LPF 6 can be sufficiently suppressed.

Figure 5:
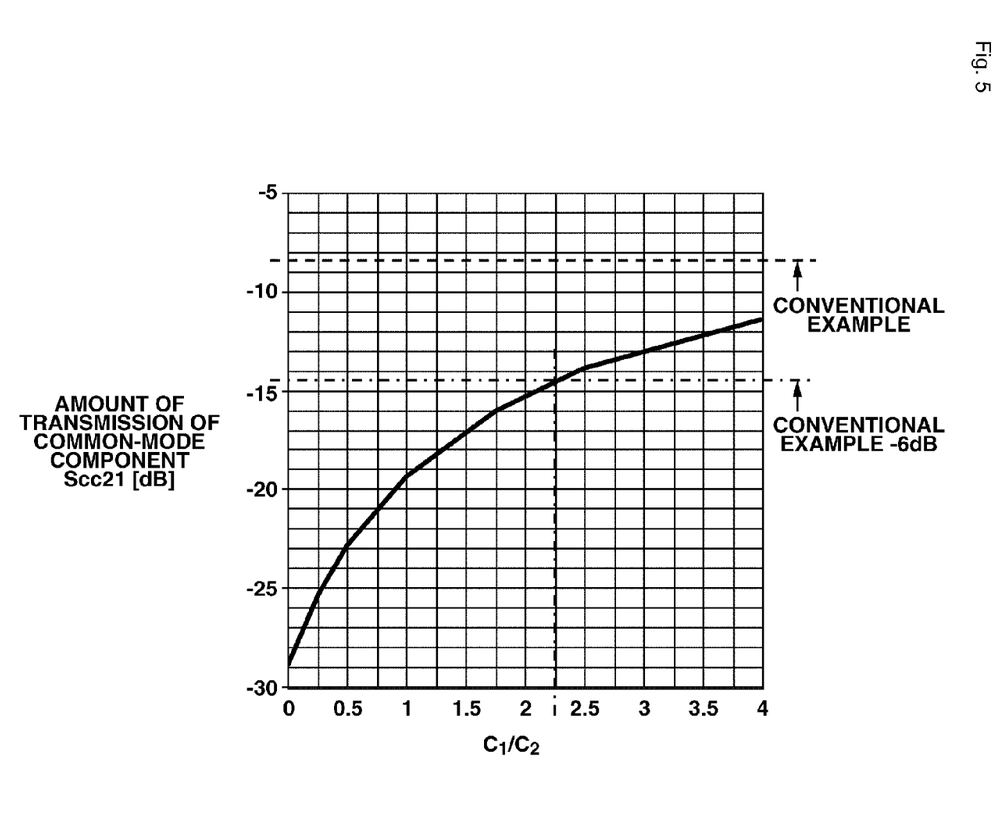
FIG. 5 is a graph representing a minimum value of an amount of transmission of a common-mode component, versus a ratio of C1 to C2.

Next, to make clear reduction capability with respect to the common-mode component, regarding the LPF 6, an amount of transmission with respect to the common-mode component in the LPF 6 has been calculated. The results are illustrated in FIG. 5. FIG. 5 is a graph representing a minimum value of an amount of transmission of the common-mode component in the LPF 6, versus a ratio of C1 to C2 (C1/C2). In FIG. 5, the horizontal axis represents a ratio of C1 to C2 (C1/C2), and the vertical axis represents a minimum value of the amount of transmission of the common-mode component. In FIG. 5, the common-mode component (i.e., Scc21[dB]) which transmits from the LPF 6 which satisfies the conditions of the above-described element values is indicated by a solid line.

The minimum value of the amount of transmission of the common-mode component herein used is the one within a range of radiation noise standard frequency band, here, a frequency band up to 1 GHz will be described. Further, the common-mode component herein used is a common-mode component arising from the differential signal transmission unit 1.

Figure 6:
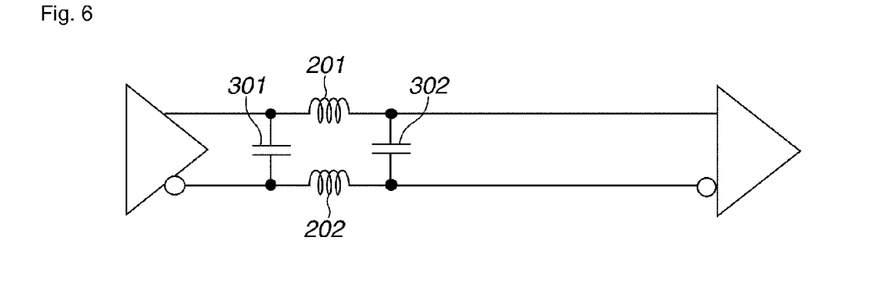
FIG. 6 is an electrical circuit diagram illustrating a schematic configuration of the differential transmission circuit of a comparative example.

On the other hand, as a comparative example, a differential transmission circuit having the same transmission characteristics as those in the LPF 6 with respect to the normal-mode component, in which capacitors 301 and 302 that constitute the LPF are connected only between the differential transmission paths is illustrated in FIG. 6. The LPF illustrated in FIG. 6 comprises two inductors 201 and 202, the capacitor 301 connected between signal input ends of the inductors 201 and 202, and the capacitor 302 connected between signal output ends of the inductors 201 and 202. In the configuration of the LPF of the comparative example illustrated in FIG. 6, inductance value of the inductors 201 and 202 is 39 nH, a capacitance value of the capacitor 301 is 18 pF, and a capacitance value of the capacitor 302 is 2.7 pF. For the LPF of the comparative example, the amount of transmission with respect to the common-mode component is calculated, similarly to the LPF 6 according to the present exemplary embodiment. The result of the comparative example is indicated by a solid line FIG. 5.

Since the capacitors 301 and 302 of the LPF illustrated in FIG. 6 are connected between the differential transmission paths, they do not exert influence on the common-mode component flowing in the same direction. Consequently, as illustrated in FIG. 5, the amount of transmission of the common-mode component is larger than that of the LPF 6.

In contrast, in the LPF 6 according to the present exemplary embodiment, the common-mode component from the differential signal transmission unit 1 can be allowed to flow to the ground (GND) via the capacitors 22 and 23 illustrated in FIG. 1. As a result, the amount of transmission of the common-mode component can be decreased to a smaller level than that in the circuit configuration illustrated in FIG. 6.

Further, from FIG. 5, it can be seen that as a value of the ratio of C1 to C2 increases, an amount of transmission of the common-mode component also increases. Generally, as an indicator value of a state where radiation noise has been suppressed, 6 dB would be enough as reduction effect. From FIG. 5, as for a value of the ratio of C1 to C2 to reduce the amount of transmission by 6 dB compared with the comparative example, the value becomes 2.25. In other words, if a value of the ratio of C1 to C2 is equal to or less than 2.25, the common-mode component arising from the differential signal transmission unit 1 can be sufficiently reduced.

To summarize the above descriptions, if a value of the ratio of C1 to C2 is equal to or more than 0.75 and equal to or less than 2.25, from FIG. 4 and FIG. 5, generation of the common-mode component due to a variation of the capacitances of the capacitors 22 and 23 can be effectively suppressed. Furthermore, the LPF 6, if a value of the ratio of C1 to C2 satisfies the above-described conditions, can also effectively reduce the common-mode component arising from the differential signal transmission unit 1.

The present invention is not limited to the exemplary embodiments and exemplary examples described above, but many modifications are possible by a person who has normal knowledge in this field within the technical ideas of the present invention.

In the above-described exemplary embodiment, a case where the fourth capacitor 31 is connected between the signal output end 11b of the first inductor 11 and the signal output end 12b of the second inductor 12 has been described as shown in FIG. 1. In this case, the generation of the common-mode component in the LPF 6 can be more effectively suppressed, but the present invention is not limited to this configuration. A case where the output side capacitor provided between the inductor unit and the differential signal reception unit comprises a first output side capacitor and a second output side capacitor is acceptable. The first output side capacitor has one end connected to the signal output end of the first inductor and other end connected to the ground. Further, the second output side capacitor has one end connected to the signal output end of the second inductor and other end connected to the ground. Even in this case, since the generation of the common-mode component in the input side capacitor unit can be suppressed, radiation noise can be reduced.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-200177 filed Sep. 14, 2011, and Japanese Patent Application No. 2012-165845 filed Jul. 26, 2012, each of which is hereby incorporated by reference herein in its entirety.

The invention claimed is:

1. A differential transmission circuit comprising:
   a differential signal transmission unit configured to transmit a digital differential signal;
   a differential signal reception unit configured to receive the digital differential signal;
   a differential signal wiring comprising a first signal line and a second signal line configured to connect the differential signal transmission unit and the differential signal reception unit;

an inductor unit comprising a first inductor provided in the first signal line and a second inductor provided in the second signal line;

an input side capacitor unit comprising a first capacitor, wherein one end thereof is connected to a signal input end of the first inductor, and the other end thereof is connected to a signal input end of the second inductor, a second capacitor, wherein one end thereof is connected to the signal input end of the first inductor, and the other end thereof is connected to a ground, and a third capacitor, wherein one end thereof is connected to the signal input end of the second inductor, the other end thereof is connected to the ground; and an output side capacitor unit configured to be provided between the inductor unit and the differential signal reception unit, wherein a difference between the capacitances of the second capacitor and the third capacitor falls within 20%, and a value of C1/C2, wherein a capacitance of the first capacitor is C1, and a capacitance of one of the second and the third capacitor is C2, is equal to or more than 0.75 and equal to or less than 2.25.

2. The differential transmission circuit according to claim 1, wherein the output side capacitor unit comprises a fourth capacitor wherein one end thereof is connected to a signal output end of the first inductor, and the other end thereof is connected to a signal output end of the second inductor.

3. The differential transmission circuit according to claim 2, wherein the inductor unit, the input side capacitor unit, and the output side capacitor unit are configured to attenuate a normal-mode component contained in the digital differential signal by cooperating with each other, and the input side capacitor unit and the output side capacitor unit are configured to attenuate a common-mode component contained in the digital differential signal by cooperating with each other.

4. The differential transmission circuit according to claim 1, wherein the output side capacitor unit comprises a fourth capacitor wherein one end thereof is connected a signal output end of the first inductor, and the other end thereof is connected to a signal output end of the second inductor, a fifth capacitor wherein one end thereof is connected to the signal output end of the first inductor, and the other end thereof is connected to the ground, and a sixth capacitor wherein one end thereof is connected to the signal output end of the second inductor, and the other end thereof is connected to the ground.

5. The differential transmission circuit according to claim 1, wherein the output side capacitor unit comprises a fifth capacitor wherein one end thereof is connected to a signal output end of the first inductor, and the other end thereof is connected to the ground, and a sixth capacitor wherein one end thereof is connected to a signal output end of the second inductor, and the other end thereof is connected to the ground.

6. A printed circuit board comprising:
a printed wiring board;
a semiconductor element configured to be mounted on the printed wiring board, and configured to transmit a digital differential signal;

a differential signal wiring configured to be formed on the printed wiring board, and configured to comprise a first signal line and a second signal line connected to the semiconductor element;

an inductor unit configured to be formed on the printed circuit board, and configured to comprise a first inductor provided on the first signal line and a second inductor provided on the second signal line;

an input side capacitor unit configured to comprise a first capacitor wherein one end thereof is connected to a signal input end of the first inductor, and the other end thereof is connected to a signal input end of the second inductor, a second capacitor wherein one end thereof is connected to the signal input end of the first inductor, and the other end thereof is connected to a ground, and a third capacitor wherein one end thereof is connected to the signal input end of the second inductor, and the other end thereof is connected to the ground; and an output side capacitor unit configured to be provided between the inductor unit and a differential signal reception unit, wherein a difference between the capacitances of the second capacitor and the third capacitor falls within 20%, and a value of C1/C2, when a capacitance of the first capacitor is C1, and a capacitance of one of the second and the third capacitor is C2, is equal to or more than 0.75 and equal to or less than 2.25.

7. The printed circuit board according to claim 6, wherein the output side capacitor unit comprises a fourth capacitor wherein one end thereof is connected to a signal output end of the first inductor, and the other end thereof is connected to a signal output end of the second inductor.

8. The printed circuit board according to claim 6, wherein the output side capacitor unit comprises a fifth capacitor wherein one end thereof is connected to a signal output end of the first inductor, and the other end thereof is connected to the ground, and a sixth capacitor wherein one end thereof is connected to a signal output end of the second inductor, and the other end thereof is connected to the ground.

9. The printed circuit board according to claim 6, wherein the output side capacitor unit comprises a fourth capacitor wherein one end thereof is connected a signal output end of the first inductor, and the other end thereof is connected to a signal output end of the second inductor, a fifth capacitor wherein one end thereof is connected to the signal output end of the first inductor, and the other end thereof is connected to the ground, and a sixth capacitor wherein one end thereof is connected to the signal output end of the second inductor, and the other end thereof is connected to the ground.

10. The differential transmission circuit according to claim 6, wherein the inductor unit, the input side capacitor unit, and the output side capacitor unit are configured to attenuate a normal-mode component contained in the digital differential signal by cooperating with each other, and the input side capacitor unit and the output side capacitor unit are configured to attenuate a common-mode component contained in the digital differential signal by cooperating with each other.

* * * * *